United States Patent [19]

Fedeli et al.

[11] Patent Number: 4,748,590
[45] Date of Patent: May 31, 1988

[54] SWAP GATE IN AN ION-IMPLANTED BUBBLE MEMORY

[75] Inventors: Jean-Marc Fedeli, Saint Egreve; Joël Magnin, Saint Martin D'Heres, both of France

[73] Assignee: Commissariat a l'Energie Atomique, Paris, France

[21] Appl. No.: 721,366

[22] Filed: Apr. 9, 1985

[30] Foreign Application Priority Data

Apr. 12, 1984 [FR] France ............... 84 05812

[51] Int. Cl.⁴ .......................... G11C 19/08
[52] U.S. Cl. ................................ 365/36
[58] Field of Search .......................... 365/36

[56] References Cited

U.S. PATENT DOCUMENTS 4,394,746 7/1983 Hirko et al. .............. 365/36
4,494,216 1/1985 Suzuki et al. ............. 365/36

FOREIGN PATENT DOCUMENTS 0058289 4/1982 Japan ..................... 365/36

OTHER PUBLICATIONS

Abstracts of Japan, vol. 6, No. 137 p. P-130 (1015), Jul. 24, 1982.

Primary Examiner—James W. Moffitt

[57] ABSTRACT

In a magnetic bubble memory having a first system of aligned ion-implanted patterns and a second system of aligned ion-implanted patterns, a swap gate having a transfer conductor for transferring a magnetic bubble from the second system to the first system, and an erase conductor for erasing the bubble to be replaced on the first system.

6 Claims, 4 Drawing Sheets

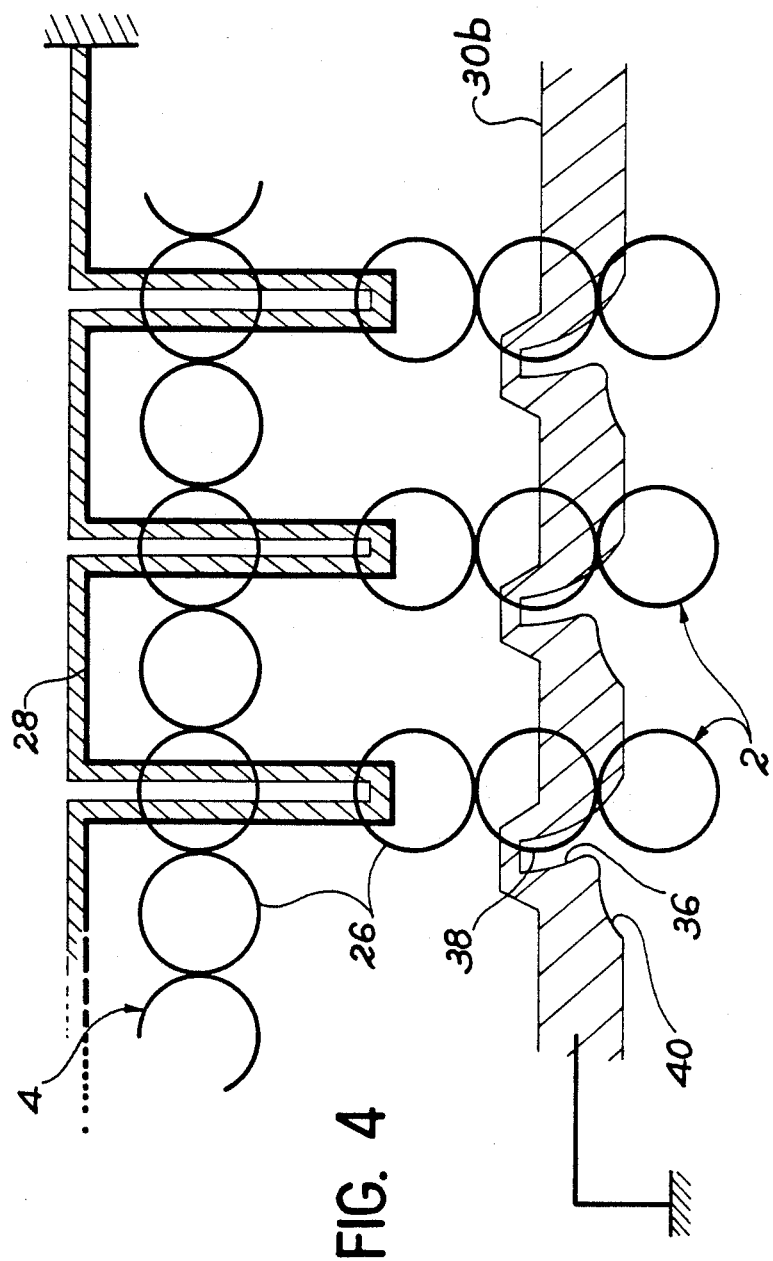

SWAP GATE IN AN ION-IMPLANTED BUBBLE MEMORY

BACKGROUND OF THE INVENTION

The present invention relates to an exchange or swap gate in a magnetic bubble memory with ion-implanted patterns. It also relates to a serial-parallel magnetic bubble memory having at least one of the said exchange or swap gates.

The invention particularly applies to the storage of binary information or bits, materialized in the form of isolated magnetic domains, called bubbles. These generally cylindrical domains have a magnetization which is the reverse of that of the remainder of the magnetic material (garnet) constituting the layer in which said domains are formed. In this memory, the duplication of the magnetic bubbles makes it possible to carry out bit by bit or bit block duplication.

In a monocrystalline magnetic layer, such as a magnetic garnet film, supported by an amagnetic monocrystalline garnet, the magnetic bubbles or domains are stable by applying a continuous magnetic field Hp perpendicular to the plane of the magnetic layer. In practice, this magnetic field is produced by a permanent magnet, thus ensuring the nonvolatility of the information contained in the memory.

In a magnetic bubble memory the bubbles are displaced by applying a rotary continuous or d.c. field $H_T$ in a direction parallel to the surface of the magnetic layer. The bubbles are displaced around so-called propagation patterns, defined in the upper part of the magnetic layer.

These patterns are shaped like disks, lozenges, triangles, T's, etc and can be made from a material based on iron and nickel, or can be obtained by implanting ions in the upper part of the magnetic layer through a mask making it possible to define the shape of said patterns. In the latter case, although ion implantation only takes place around the pattern, the latter are also called ion-implanted patterns. The propagation patterns are generally contiguous and, as a result of their shape, two adjacent patterns define two cavities or hollows between them.

The movement of the bubbles along these patterns generally takes place over a period of time equal to one third of the rotation period of the planar magnetic field $H_T$, the bubbles remaining stationary in the cavity defined between two adjacent patterns throughout the remainder of the cycle. These cavities constitute so-called stable positions. In this way, shift registers are formed, in which the binary information 1 is represented by the presence of a bubble and binary information 0 by the absence of a bubble.

Apart from these propagation patterns, it is necessary to use electrical conductors for carrying out the following functions in the bubble memories writing: information recording, non-destructive reading, register-to-register transfer and erase.

One of the main known magnetic bubble memory types comprises a system of minor loops or registers used for storing information, associated with one or two major loops or registers constituting the memory access stations. The minor loops are arranged in longitudinally juxtaposed manner and the major loops are oriented perpendicularly to the minor loops. The magnetic bubbles are located in the minor loops and can be transferred into the major loops and vice versa, by means of unidirectional or bidirectional transfer gates.

When a single major loop is used, the reading and writing of the information takes place by means of said single loop. In the first case, reference is made to a memory having a major—minor organisation. However, when using two major loops, the information is written by means of one of these loops and the reading of the information by the other loop. These major loops are generally located on either side of minor loops. In the later case with two loops, reference is generally made to a memory having a serial-parallel organisation.

In the aforementioned bubble memories the production of a bubble on a major loop, corresponding to the writing of information, is carried out by applying a high current to a generally U-shaped conductor traversing the propagation patterns constituting the major loop. This operation, which is generally called nucleation, is carried out when the bubble is in a cavity defined between two adjacent patterns.

After nucleation, the bubble is then propagated, by applying rotary field $H_T$ to the major loop to the transfer gates in order to transfer the bubble from the major loop to a minor loop. These transfer gates are generally constituted by a U-shaped conductor traversing the patterns forming the minor loop. The application of a current pulse to said conductor makes it possible to extend each bubble between the tops of the propagation patterns of the major loop and those corresponding to the minor loop and then, the stopping of the current pulse leads to the contraction of the bubbles on the minor loop. Transfer is then realised. Thus, the information is stored on the minor loop.

The reading of this information takes place by transferring a magnetic bubble from a minor loop to a major loop, transfer taking place in the manner described hereinbefore.

In order to read an information in a non-destructive manner, the corresponding bubble must be duplicated. In the case of a bubble-by-bubble duplication, this is carried out by means of a conductor traversing the major loop, to which is applied a current pulse, leading to the elongation of the bubble on either side of the propagation path, followed by the splitting of said bubble into two. Thus, one of these bubbles, transferred on a detection path, can be destructively detected by a magnetoresistive detector, generally based on iron and nickel, whereas the other bubble is reinjected into the minor loop at the location occupied by the original bubble.

A swap gate, like that according to the invention, makes it possible to replace one information by another in a loop of a bubble memory. These swap gates are mainly used for writing an information into a minor loop by the transfer of said information from the major writing loop to the said minor loop. However, this swap gate can obviously be used in any random part of a bubble memory whenever one information has to be replaced by another.

A swap gate for a bubble memory with ion-implanted patterns is described in U.S. Pat. No. 4,394,746 filed on Dec. 16, 1981 and entitled "Swap gate for ion-implanted contiguous disk bubble devices". FIG. 1 shows a swap gate according to the teaching of this patent. FIG. 2 illustrates the operation of this swap gate.

FIG. 1 shows folded minor loops 2, a major loop 4 and exchange or swap elements 6, positioned between the major loop and the folded terminal part of the minor loop. Each swap element 6 has a first part 8 for swapping bubbles with the major loop, a second part 10 for receiving the bubbles from a first region 12 of the folded part of the minor loop 2 and a third part 14 for transferring the bubbles from the first part 8 to a second region 16 of the folded part of the minor loop 2. A pattern 18 is arranged between the first region 12 and the second region 16 of the minor loop 2 for forming two storage positions of the bubbles in the minor loop 2.

A first conductor 18 is also arranged between the major loop and the first part 8 of the exchange or swap element for forming a first transfer gate. A second conductor 20 is also positioned between the second part 10 of the swap element and the first region 12 of the minor loop, in order to form a second transfer gate. Finally, the third part 14 of the swap element is arranged so as to form a joining element with the second region 16 of the minor loop.

FIG. 2 is a larger scale view of a swap element positioned between a minor loop and the major loop. The dotted line arrows indicate the direction of movement of the magnetic bubbles along the ion-implanted patterns. It is possible to see the successive positions of a magnetic bubble 22 to be transferred to the major loop and a magnetic bubble 24 to be transferred to the minor loop, as a function of the phases of the rotary field $H_T$ numbered 1, 2, 3, 4. Letters a, b, c, d designated the successive rotations of rotary field, $H_T$. Letters a', b', c', d' have the same meaning. For reasons of clarity, the electrical conductors are not shown.

Magnetic bubble 22 is replaced by magnetic bubble 24 in the minor loop in the following way. During the first rotation of field $H_T$, the magnetic bubble 24 is moved along the major loop 4 and is transferred to the first part 8 of the swap element 6 by an adequate current pulse on the transfer conductor. During this time, bubble 22 is displaced on minor loop 2 and reaches the first region 12.

During the first half of the second rotation b of rotary field $H_T$, said bubble is transferred to the second region 10 of swap element 6. It is then propagated along said pattern in the clockwise direction until it reaches the first part 8 of the exchange element at the start of the fourth rotation d of rotary field $H_T$.

In the same way, during the second rotation B' and the first half of the third rotation c' of rotary field $H_T$, bubble 24 moves along the swap element 6 to reach the third part 14. In the second half of said third rotation c', the said bubble is transferred to the second part 16 of minor loop 2. Thus, at time d'1, magnetic bubble 24 occupies the position which would have been occupied by bubble 22 if it had been propagated along the minor loop 2. The replacement of bubble 22 by bubble 24 is consequently completed. However, it remains necessary to transfer bubble 22 into position d1 on the major loop by a current pulse on the transfer conductor, followed by passing the said bubble to an annihilator located at the end of the major loop 4.

The swap gate described hereinbefore illustrates a recent prior art. In this swap gate, as in the other known swap gates, formed both in ion-implanted patterns and in a magnetic alloy of the iron—nickel type, the writing of an information into a minor loop always takes place by a double transfer between the minor loop and the major loop, the information to be erased being transferred to the major loop for destruction in an annihilator.

The swap gate according to the invention is based on a different principle. In this, transfer solely takes place from the major loop to the minor loop for supplying the new information to be stored. In the swap gate according to the invention, the information to be erased is not transferred to the major loop and is instead directly destroyed on the minor loop.

This more particularly makes it possible to eliminate the swap element and consequently to simplify the construction of the swap gates, whilst it also makes it possible to carry out said transfer more quickly, i.e. in a smaller number of cycles of rotary field $H_T$.

SUMMARY OF THE INVENTION

The present invention specifically relates to a swap gate for a magnetic bubble memory with ion-implanted patterns having a magnetic material layer in which bubbles can be displaced by applying a rotary field $H_T$ in first and second propagation paths, the first path being defined by a first system of ion-implanted patterns aligned along an axis, the second path being defined by a second system of ion-implanted patterns aligned along another axis, said axes being transverse, said swap gate comprising an activated electrical conductor for transferring a bubble from the second propagation path to the first propagation path, wherein the swap gate further comprises an electrical erase conductor interrupting the first system of patterns along an axis perpendicular to the alignment axis of the patterns of said first system.

According to another feature of the swap gate according to the invention, the axis of the electrical conductor is arranged in such a way that the erase position of a bubble is located at the top of an ion-implanted pattern.

In a preferred manner, said pattern is the penultimate pattern of the first system of ion-implanted patterns.

According to a first embodiment, the erase conductor is U-shaped. According to a second embodiment, the erase conductor is linear and has, at the erase position of the first system, a notch which is substantially parallel to the alignment axis of the patterns of said first system.

BRIEF DESCRIPTION OF THE DRAWINGS

The features and advantages of the invention can be gathered from the following description of non-limitative embodiments and with reference to the attached drawings, wherein show:

FIG. 4 a second embodiment of the swap gate in a magnetic bubble memory with ion-implanted patterns according to the invention.

DETAILED DESCRIPTION OF THE PREFERRED EMBODIMENTS

Figure 1:
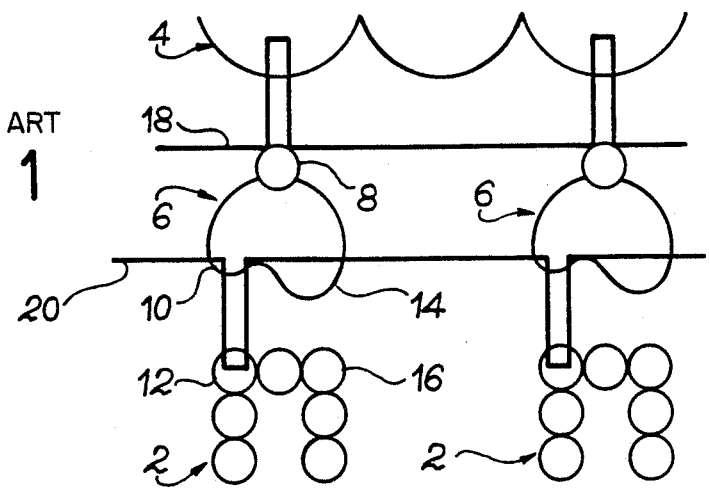
FIGS. 1 and 2, already described, a swap gate in a bubble memory with ion-implanted patterns and the operation of said swap gate according to the prior art.
Figure 2:
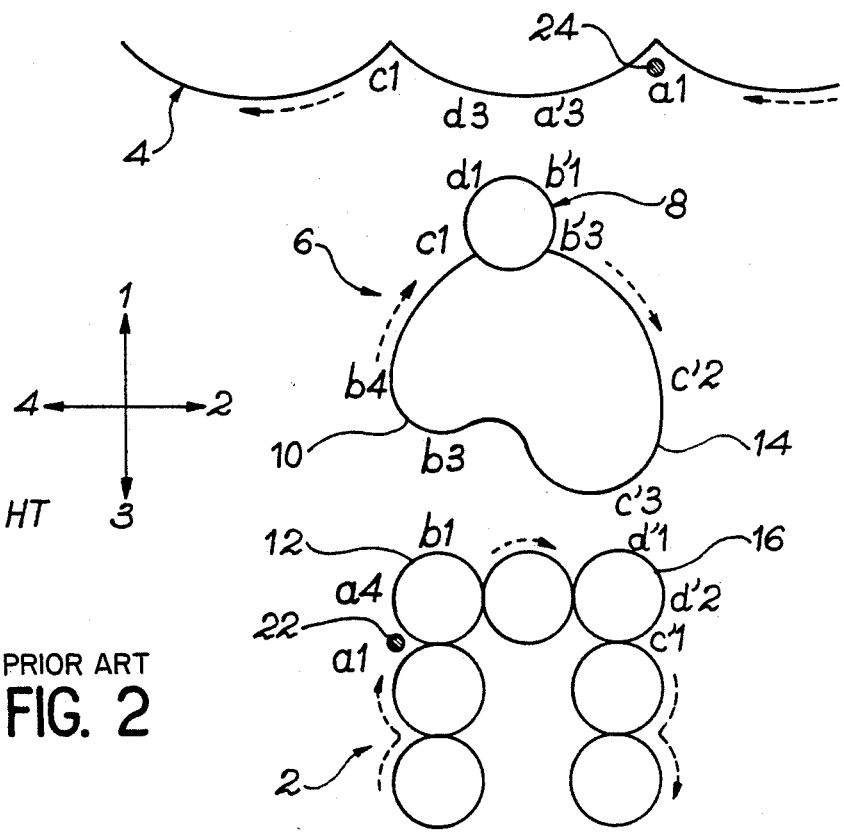
Figure 3:
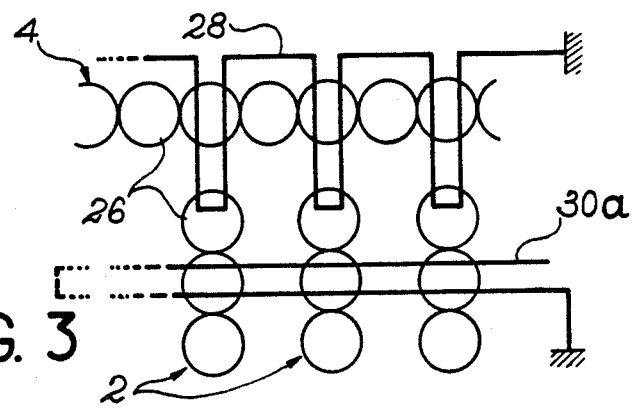
FIG. 3 a first embodiment of a swap gate in a magnetic bubble memory with ion-implanted patterns according to the invention.

FIG. 3 shows a first embodiment of the swap gate according to the invention, which comprises two conductors, namely a transfer conductor 28 and an erase conductor 30a.

A swap gate is arranged between each minor loop 2 constituted by a system of aligned ion-implanted patterns 26 and a major loop 4, which is also constituted by a system of ion-implanted patterns 26 aligned in accordance with an axis perpendicular to the minor loops.

The transfer conductor 28 makes it possible to transfer a bubble from the major loop 4 to a minor loop 2. It is generally U-shaped and is arranged in the axis of the minor loop 2, so as to cover the end of the said minor loop and traverse the major loop 4.

According to the invention, on each minor loop 2 there is an erase conductor 30a, which can e.g. be U-shaped and whose axis is parallel to the axis of the major loop 4. Thus, at each minor loop 2, it forms a system of two parallel conductive lines. When a current pulse of adequate polarity and intensity is applied to said erase conductor, the bubbles of the minor loop 2 located between the two parallel lines of said conductor are destroyed.

FIG. 4 shows a second embodiment of the swap gate according to the invention, in which the erase conductor 30b is linear. The identical elements to those of FIG. 3 are given the same references in FIG. 4.

At each erase position, the erase conductor 30b has a notch 36, whereof the direction is substantially perpendicular to the axis of the erase conductor 30b. This notch is preferably centered on the boundary of the ion-implanted pattern and at an adequate depth to cover the erase position which, in a preferred manner, coincides with the top 38 of the ion-implanted pattern, i.e. the less stable position of a magnetic bubble.

The general shape of the erase conductor 30b is linear. Local recesses such as 40 can, however, be provided to obviate any disturbance to the advance of the bubbles on the propagation path. The shape of the erase conductor is also calculated so as to avoid interactions with the bubbles on either side of the propagation path.

The erase conductor has the advantage of a low resistance, which is less than that of the erase conductor of the swap gate of FIG. 3 and consequently only requires a low power current generator.

A description will now be given of the operation of the swap gate according to the invention, with reference to FIG. 5a. This description is applicable to the two embodiments of the invention shown in FIGS. 3 and 4.

Figure 5A:
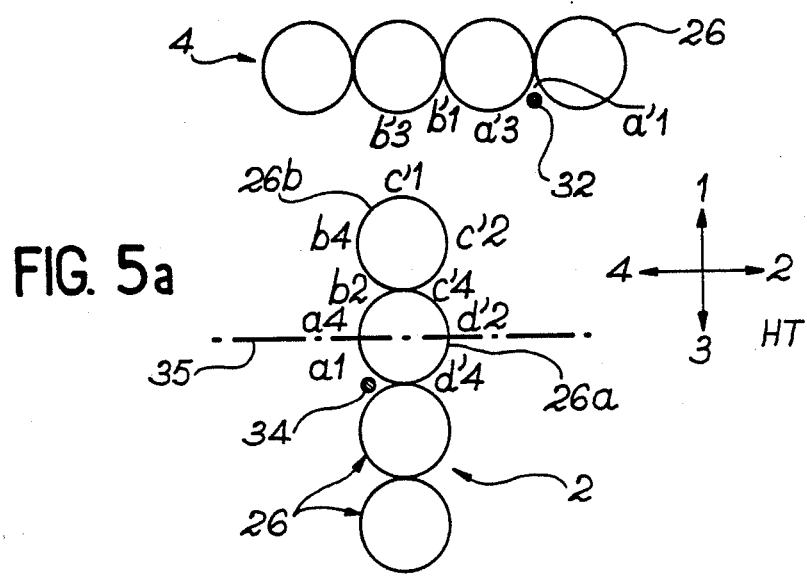
FIG. 5a the operation of the swap gate according to the invention.

FIG. 5a shows a minor loop 2 and a major loop 4, each constituted by aligned, ion-implanted patterns 26. The alignment axes of these two loops are perpendicular to one another and the loops are arranged in such a way that it is possible to transfer a magnetic bubble from one loop to the other. The transfer conductor is not shown in FIG. 5a.

A description will now be given of the operation of the swap gate enabling a magnetic bubble 32 present on the major loop 4 to replace the magnetic bubble 34 present on the minor loop 2. For this purpose, the position of each of these bubbles is indicated, as a function of the phase of the rotary field $H_T$ designated by a figure from 1 to 4 and as a function of the successive rotations of said rotary field, designated by the alphabetical letters a and b for magnetic bubble 34 and a',b',c',d' for magnetic bubble 32. During the first rotation of field $H_T$, the magnetic bubble 32 to be stored moves from a cavity along the major loop 4. During this time, the magnetic bubble 34 to be erased moves along the minor loop 2 and is aligned at time a4 with the erase conductor symbolized by axis 35.

Figure 5B:
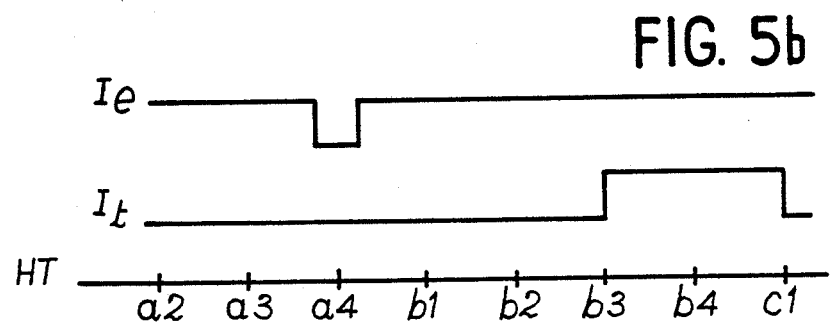
FIG. 5b a chronogram of the current pulses applied to the transfer and the erase conductors of the swap gate according to the invention.

The configuration of the erase current pulse $I_e$ applied to the erase conductor is represented in FIG. 5b in relation with the phase of the rotary field $H_T$. The sign of this current pulse is such that the magnetic field which is produces between the conducting lines of the erase conductor has a direction which is the reverse of the direction of the magnetic field of the bubble.

As shown in FIG. 5b, the pulse is negative when the erase conductor 30a, 30b is connected to earth, in the manner shown in FIGS. 3 and 4 and when the continuous magnetic field Hp is such that the visible face of the magnetic bubbles of FIG. 5a is a north pole.

Returning to FIG. 5a, it can be seen that the position d'2 is also an erase position. However, the erase pulse $I'_e$ is applied at time 4 of rotary field $H_T$ and consequently no bubble is present at location d'2 at this time. Thus, the erase pulse makes it possible to only erase the bubble located in position a4.

During the second rotation b' of the rotary magnetic field $H_T$, the magnetic bubble 32 to be stored moves along the major loop 4 to the transfer position. A transfer current pulse $I_t$, whose synchronization with the rotary field $H_T$ is given in FIG. 5b, is then applied. This brings about the transfer of the magnetic bubble 32 from major loop 4 to minor loop 2.

At the beginning of the third rotation c' of the rotary magnetic field $H_T$, the bubble is located at the top of the minor loop 2. This is exactly the position which would have been occupied by the magnetic bubble 34, if it had not been erased. Thus, the replacement of the information is completed.

In FIG. 5b, the transfer pulse $I_t$ is positive. Obviously, as in the case of the erase pulse $I_e$, the sign of the transfer pulse is linked with the end of the transfer conductor 28 connected to earth and with the direction of the continuous magnetic field Hp. The transfer pulse $I_t$ is positive, in the manner shown in FIG. 5b, when the erase conductor is connected to earth in the manner shown in FIGS. 3 and 4 and when the continuous magnetic field Hp has the direction indicated hereinbefore.

The erase conductor, indicated by the axis 35 in FIG. 5a, traverses the penultimate pattern 26a of the minor loop 2. It is obvious that this position is not imperative and that the erase conductor can also be positioned above any pattern of minor loop 2, including the final pattern 26b. In the latter case, the erase pulse $I_e$ will be transferred from time a4 to time b4.

Figure 6:
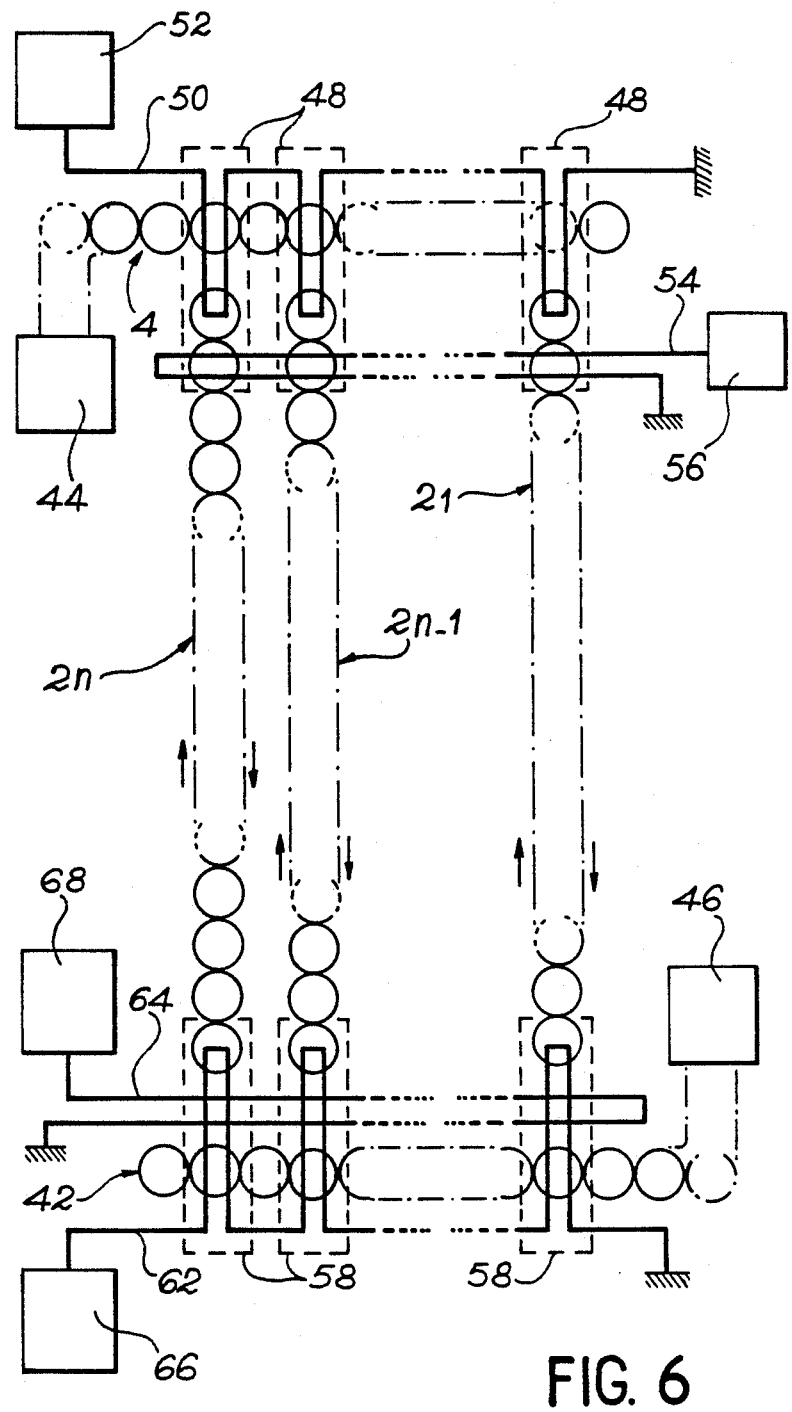
FIG. 6 a diagrammatic view of the structure of a magnetic bubble memory with ion-implanted patterns of the serial-parallel type, whose swap gates are in accordance with the invention.

FIG. 6 is a diagrammatic view of a magnetic bubble memory with ion-implanted patterns, whose swap gates are in accordance with the invention.

This bubble memory mainly comprises n minor loops $2_1, 2_2 \ldots 2_n$ which are longitudinally aligned, a major writing loop 4 and a major reading loop 42 positioned perpendicularly to the minor loops. The minor loops can e.g. be aligned along an easy magnetization axis of the crystalline layer of magnetic material in which the magnetic bubbles are displaced. A means 44 for generating magnetic bubbles injects bubbles into the writing loop 4. Symmetrically, a detector 46, e.g. a magnetoresistive detector, connected to the major reading loop receives magnetic bubbles from said loop.

Swap gates 48 are positioned between each minor loop and the major writing loop. According to the invention, each of these swap gates comprises means for transferring a magnetic bubble from the major writing loop to a minor loop and means for erasing a magnetic bubble of the minor loop.

In the embodiment of FIG. 6, transfer takes place by a conductor 50 connected to a pulse generator 52 and erasure is carried out by an erase conductor 54 connected to a pulse generator 56.

Conductor 50 is e.g. constituted by a sequence of U-shaped segments at each minor loop. These segments, which are connected in series, permit the block transfer of bubbles from the major loop 4 to the minor loops. Erase conductor 54 is e.g. U-shaped and is arranged perpendicularly to the minor loops and covers all of them. It carries out a block erasure of the magnetic bubbles contained between its conducting line forming the branches of the U.

Duplicators 58 are positioned between the other end of each minor loop and the major reading loop 42. Several duplicator types are known. FIG. 6 shows duplicators comprising an extension conductor 6 and an interrupt conductor 62. Extension conductor 60 is e.g. constituted by a sequence of U-shaped segments at each minor loop. These segments are connected in series. On receiving a pulse from a pulse generator 66, they stretch the magnetic bubble located at the end of each minor loop between said minor loop and the major reading loop 42.

The interrupt conductor 64 is e.g. U-shaped and is arranged between the minor loops and the major reading loop so as to intersect each U-shaped segment of the extension conductor. These duplicators permit the block transfer of bubbles from the minor loops to the major reading loop.

What is claimed is:

1. A swap gate for a magnetic bubble memory with ion-implanted patterns having a magnetic material layer in which bubbles can be displayed by applying a rotary field $H_T$ in first and second propagation paths, the first path being defined by a first system of ion-implanted patterns aligned along a first axis, the second path being defined by a second system of ion-implanted patterns aligned along a second axis, said axes being transverse to each other; said swap gate comprising: an activated electrical transfer conductor for transferring a bubble from the second propagation path to the first propagation path, and in addition also comprising an electrical erase conductor interrupting the first system of patterns along an axis perpendicular to the first axis of the patterns of said first systems.

2. A swap gate according to claim 1, wherein the electrical conductor is arranged in such a way that the erase position of a bubble is located at the top of a ion-implanted pattern.

3. A swap gate according to claim 2, wherein the pattern is a penultimate pattern of the first system of ion-implanted patterns.

4. A swap gate according to claim 2, wherein the erase conductor is U-shaped.

5. A swap gate according to claim 2, wherein the erase conductor is linear and has, at an erase position of the first system, a notch which is substantially parallel to the alignment axis of the patterns of said first system.

6. A magnetic bubble memory with ion-implanted patterns comprising a plurality of first systems of ion-implanted patterns forming minor loops and which are aligned, a second system of ion-implanted patterns forming a major writing loop and arranged perpendicularly to said minor loops, means for generating bubbles on said writing loop, swap gates for block transfer of a bit from the writing loop into each minor loop, a third system of ion-implanted patterns forming a major reading loop and arranged perpendicularly to the minor loops, a detector for the bubbles on said reading loop, and duplicators for block duplication of a bit of each minor loop in the reading loop, and a plurality of swap gates respectively comprising an activated electrical conductor for transferring a bubble from the second to the first systems, and also respectively comprising an electrical erase conductor interrupting the first systems along an axis perpendicular to the aligned first systems.

* * * * *